(12) United States Patent
Liu et al.

(10) Patent No.: US 6,627,844 B2
(45) Date of Patent: Sep. 30, 2003

(54) METHOD OF LASER MILLING

(75) Inventors: Xinbing Liu, Acton, MA (US);
Chen-Hsiung Cheng, Chelmsford, MA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/267,023

(22) Filed: Oct. 8, 2002

(65) Prior Publication Data

US 2003/0103108 A1 Jun. 5, 2003

Related U.S. Application Data

(60) Provisional application No. 60/334,820, filed on Nov. 30, 2001.

(51) Int. Cl.⁷ ............................................. B23K 26/00
(52) U.S. Cl. .............................. 219/121.71; 219/121.7; 219/121.69
(58) Field of Search .......................... 219/121.71, 121.7, 219/121.68, 121.69, 121.85

(56) References Cited

U.S. PATENT DOCUMENTS

| | | | | |
|---|---|---|---|---|
| 5,149,937 A | * | 9/1992 | Babel et al. ............ | 219/121.68 |
| 5,189,437 A | * | 2/1993 | Michaelis et al. ............ | 346/1.1 |
| 5,208,980 A | * | 5/1993 | Hayes ........................ | 29/890.1 |
| 5,703,631 A | * | 12/1997 | Hayes et al. .................. | 347/47 |
| 6,040,552 A | * | 3/2000 | Jain et al. ................. | 219/121.7 |
| 6,089,698 A | * | 7/2000 | Temple et al. ................. | 347/47 |
| 6,172,329 B1 | * | 1/2001 | Shoemaker et al. ... | 219/121.69 |
| 6,303,900 B1 | * | 10/2001 | Tachikawa ............... | 219/121.7 |

* cited by examiner

*Primary Examiner*—M. Alexandra Elve
(74) *Attorney, Agent, or Firm*—Harness, Dickey & Pierce, PLC

(57) ABSTRACT

A method of laser milling varied shape, geometrically repeatable holes is disclosed where a laser drilling system is provided to ablate material, desired hole geometry is determined based on customer specifications, ablation rate is determined using laser drilling system parameters, and a tool path algorithm is determined based on the geometry, ablation rate, and laser drilling system parameters. The laser milling method may be used in combination with single or parallel processing.

24 Claims, 8 Drawing Sheets

METHOD OF LASER MILLING

CROSS-REFERENCE TO RELATED APPLICATIONS

This application claims the benefit of U.S. Provisional Application No. 60/334,820, filed on Nov. 30, 2001. The disclosure of the above application is incorporated herein by reference.

FIELD OF THE INVENTION

The present invention generally relates to material ablation with pulsed light sources and particularly relates to laser drilling and laser milling.

BACKGROUND OF THE INVENTION

Material ablation by pulsed light sources has been studied since the invention of the laser. Reports in 1982 of polymers having been etched by ultraviolet (UV) excimer laser radiation stimulated widespread investigations of the process for micromachining. Since then, scientific and industrial research in this field has proliferated—mostly spurred by the remarkably small features that can be drilled, milled, and replicated through the use of lasers.

Ultrafast lasers generate intense laser pulses with durations from roughly $10^{-11}$ seconds (10 picoseconds) to $10^{-14}$ seconds (10 femtoseconds). Short pulse lasers generate intense laser pulses with durations from roughly $10^{-10}$ seconds (100 picoseconds) to $10^{-11}$ seconds (10 picoseconds). A wide variety of potential applications for ultrafast lasers in medicine, chemistry, and communications are being developed and implemented. These lasers are also a useful tool for milling or drilling holes in a wide range of materials. Hole sizes as small as a few microns, even sub-microns, can readily be drilled. High aspect ratio holes can be drilled in hard materials, such as cooling channels in turbine blades, nozzles in ink-jet printers, or via holes in printed circuit boards.

The ability to drill holes as small as microns in diameter is a basic requirement in many high-tech manufacturing industries. The combination of high resolution, accuracy, speed, and flexibility has allowed laser processing to gain acceptance in many industries, including the (manufacture of integrated circuits, hard disks, printing devices, displays, interconnects, and telecommunication devices.

Hole shape is critical to the individual manufacturing application. Laser systems are more flexible to use in milling because appropriate programming can easily engineer custom-designed and tapered two-dimensional (2D) and three-dimensional (3D) structures. However, as the required feature size for these structures decreases, mass production of micromachined products becomes more difficult to conduct in a rapid, cost-effective manner that consistently meets product specifications. The need remains, however, for a method of laser milling that solves several problems that continue to exist in the field of material ablation with pulse light sources.

One problem that continues to exist in the field of material ablation with pulse light sources relates to milling holes of varying shapes that require controlled taper angles. Current market applications for precision milled materials require a variety of shapes and taper angles. Technologies used in the past to remove (or ablate) workpiece materials include electric discharge machining (EDM) and excimer lasers with masking. However, such methods require extensive set-up and development times to mill varying materials and taper angles. What is needed is a way to mill holes of varying shapes that require controlled taper angles.

Another problem that continues to exist in the field of material ablation with pulse light sources relates to milling holes in a variety of materials with varying material thicknesses. Excimer lasers are currently used for milling holes; however, they are primarily used on polymeric materials and are not versatile due to requirements for masking. The current market for micromachining encompasses a wide variety of materials and applications. What is needed is a way to mill holes in a variety of materials with varying material thicknesses.

Another problem that continues to exist in the field of material ablation with pulse light sources relates to milling geometrically repeatable holes using parallel processing. Conventional techniques for milling materials incorporate a single beam (such as an excimer laser) and a masking technique. Although these processes are effective for single-hole milling, they do not allow for multiple or parallel processing of more than one hole at a time. What is needed is a way to mill geometrically repeatable holes using parallel processing.

Another problem that continues to exist in the field of material ablation with pulse light sources relates to milling materials without requiring a masking process. Current methods of milling typical workpiece materials include such techniques as excimer laser milling. Excimer laser milling typically requires a masking material to be placed onto the workpiece surrounding the hole target area. The excimer laser ablates all the unmasked material on the workpiece. However, to form a tapered angle in the workpiece, a mask must be made for each individual layer of ablation. This technique is time consuming and generates excessive amounts of wasted energy. What is needed is a way to mill materials without requiring a masking process.

SUMMARY OF THE INVENTION

The present invention is a method of laser milling varied shape, geometrically repeatable holes where a laser drilling system is provided to ablate material. Desired hole geometry is determined based on customer specifications, ablation rate is determined using laser drilling system parameters, and a tool path algorithm is determined based on the geometry, ablation rate, and laser drilling system parameters. The laser milling method may be used in combination with single or parallel processing.

To simplify description of the laser milling process, the laser milling process according to the present invention is described with respect to making round hole shapes. It should be understood, however, that the present invention is not limited to round shapes only. Other shapes, such as rectangles and triangles can be milled using the same process described herein. Moreover, it should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

The present invention is a method of laser milling that can be used to produce holes in a variety of geometrically repeatable shapes without causing buildup of ablated material. Further, the process can be used to parallel-process a plurality of milled holes simultaneously.

Figure 1:
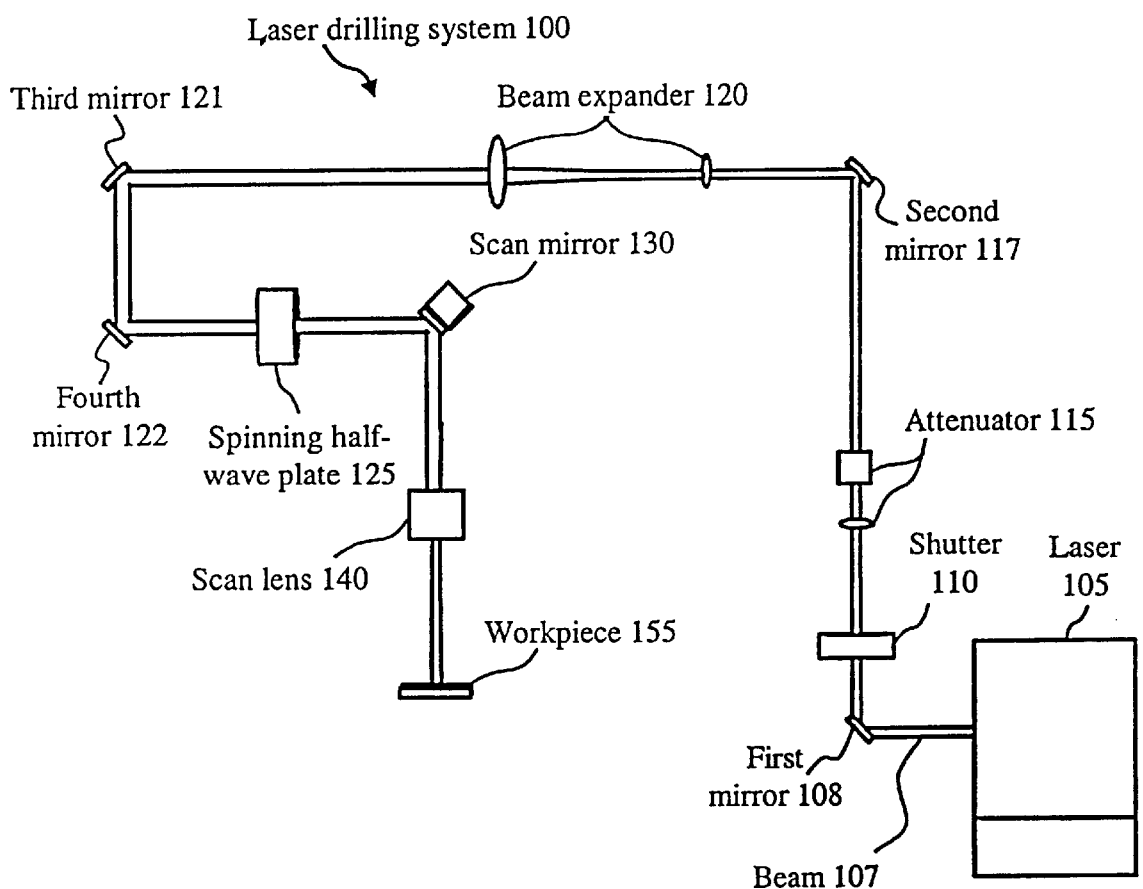
FIG. 1 is a block diagram presenting a simplified schematic of a laser drilling system.

Referring to FIG. 1, a simplified schematic of laser drilling system 100, includes a laser 105, a beam 107, a shutter 110, an attenuator 115, a beam expander 120, a spinning half-wave plate 125, a first mirror 108, a second mirror 117, a third mirror 121, a fourth mirror 122, a scan mirror 130, a scan lens 140, and a workpiece 155, arranged as shown. Although the present invention, uses a picosecond laser system, the present invention may be generalized for use with other laser systems, such as excimer, $CO_2$, and copper vapor laser systems. A brief description of operation of laser drilling system 100 is provided below. In alternate embodiments, changes in the elements of laser drilling system 100 may be required. The present invention is not limited to the current selection and arrangement of elements in laser drilling system 100.

In operation, picosecond laser 105 emits beam 107 along the optical path identified in FIG. 1 above. Beam 107 propagates along the optical path, where it is incident upon first mirror 108. First mirror 108 redirects beam 107 along the optical path, where it is incident upon shutter 110. Shutter 110 opens and closes to selectively illuminate the work piece material. Beam 107 exits shutter 110 and propagates along the optical path to attenuator 115. Attenuator 115 filters the energy of picosecond laser 105 in order to precisely control ablation parameters Beam 107 exits attenuator 115 and propagates along the optical path, where it is incident upon second mirror 117. Second mirror 117 redirects beam 107 along the optical path, where it is incident upon beam expander 120.

Beam expander 120 increases the size of beam 107, and increases the beam size to match the scan lens pupil size. Beam 107 exits beam expander 120 and propagates along the optical path, where it is incident upon third mirror 121. Third mirror 121 redirects beam 107 along the optical path, where it is incident upon fourth mirror 122. Fourth mirror 122 redirects beam 107 along the optical path, where it is incident upon spinning half-wave plate 125. Spinning half-wave plate 125 changes the polarization of beam 107. Upon exiting spinning half-wave plate 125, beam 107 propagates along the optical path, where it is incident upon scan mirror 130.

Scan mirror 130 moves in a pre-defined pattern using a milling algorithm (not shown) to drill the holes in workpiece 155. Scan mirror 130 redirects beam 107 along the optical path, where it is incident upon scan lens 140. Scan lens 140 determines the spot size of sub-beams 137 upon workpiece 155. Beam 107 exits scan lens 140 and propagates along the optical path, where it is incident upon workpiece 155. Beam 107 ablates workpiece 155 in a pattern according to the pre-defined milling algorithm.

The use of a short pulse (picosecond) laser source in the present invention solves the problem of minimizing excess thermal effects that lead to misshapen and distorted hole shapes. Thermal effects can also cause other undesirable effects, like thermal damage to substrates.

The milling algorithm is defined and communicated to picosecond laser drilling system 100 with a computing means such as a computer (not shown). The computer sends signals to shutter 110 and scan mirror 130 according to the parameters specified in the milling algorithm.

Figures 2A, 2B, 2C:
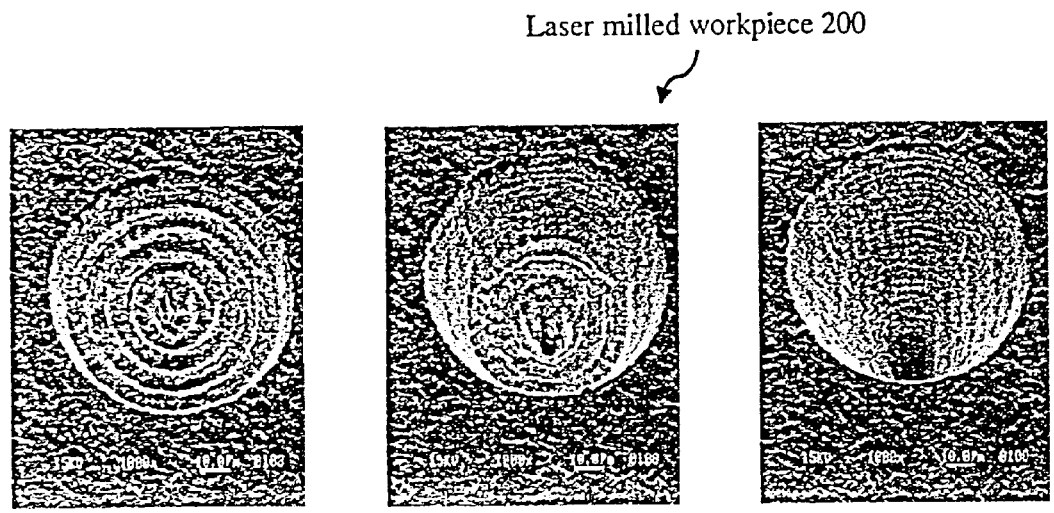
FIG. 2 is a combination of cutaway and perspective views of a laser-milled workpiece.
Figure 2D:
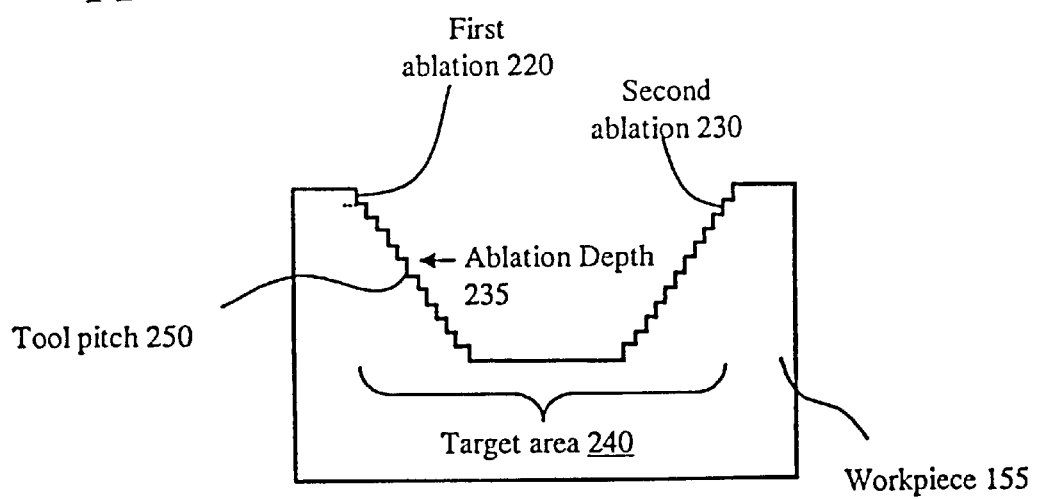
Figure 2E:
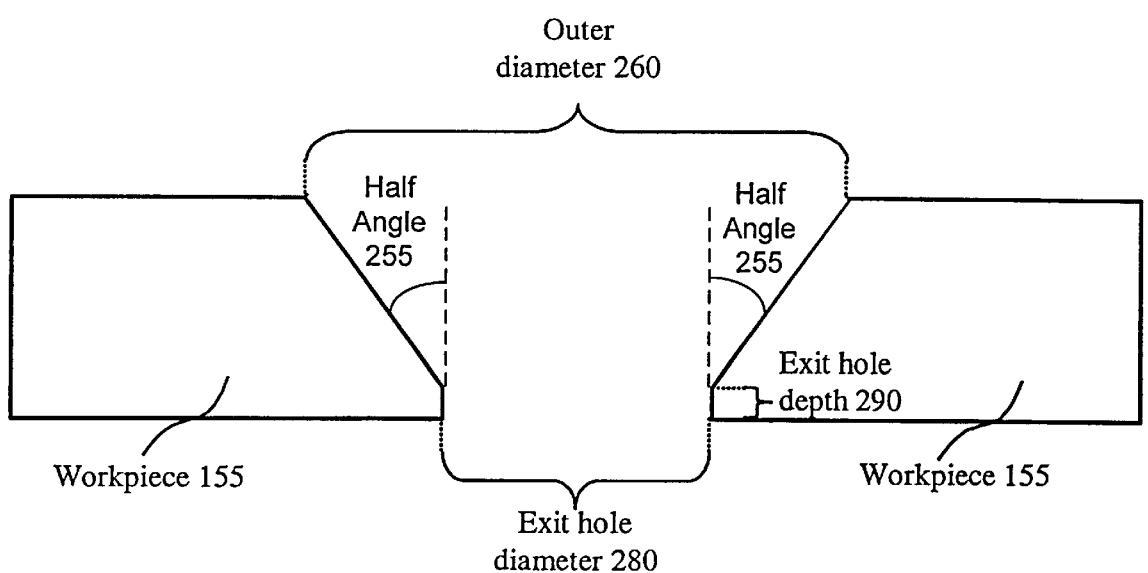

Referring to FIGS. 2a, 2b, and 2c, a laser-milled workpiece 200 is milled as described with reference to FIG. 3, below. Referring to FIG. 2d, a cross-sectional view of laser-milled workpiece 200 includes workpiece 155, a first ablation 220 and a second ablation 230 within a target area 240, and a tool pitch 250. However, the present invention can be used for any number of successive ablations. Referring to FIG. 2e, a cross-sectional view of laser-milled workpiece 200 includes workpiece 155, a pair of half angles 255, an outer diameter 260, an exit hole diameter 280, and an exit hole depth 290.

Referring to FIGS. 2d–2e, the outer diameter of first ablation 220 is predetermined by the customer specifications for outer diameter 260, half angle 255, and exit hole diameter 280 of target area 240, but typically ranges between 20 $\mu$m and 200 $\mu$m. The depth of first ablation 220, in the present example, is 1 $\mu$m. However, the depth of first ablation 220 may be as deep as 10 $\mu$m, or as shallow as 0.001 $\mu$m, depending on the desired taper specifications and hole depth required in workpiece 155. For a given material, higher incident laser intensity and/or slower linear milling speed creates larger ablation depth with a coarser wall finish, possibly resulting in staircase-like walls, as shown in an exaggerated manner in FIG. 2d. In contrast, the use of lower incident laser intensity and/or faster linear milling speed gives smaller ablation depth, resulting in smoother walls.

In an alternate embodiment, a tapered hole with a rectangular contour is created using the laser milling process. A first rectangular area with sides a and b that define a rectangle is ablated by either rastering the laser beam over the prescribed area, or by moving the laser beam along a rectangular, spiraling path over the prescribed area. A second rectangular area with reduced side lengths a–δa and b–δb is subsequently ablated within the first rectangular ablated area. The process continues until the desired, tapered rectangular hole is created.

Tool pitch 250 determines the size of the decrement for the diameter of second ablation 230 and all successive ablations, based on the spot size of laser drilling system 100 and the desired taper angle of target area 240. Tool pitch 250 is shown in the present example as 1 $\mu$m, but may be as wide as 10 $\mu$m, or as narrow as 0.001 $\mu$m.

Figure 3:
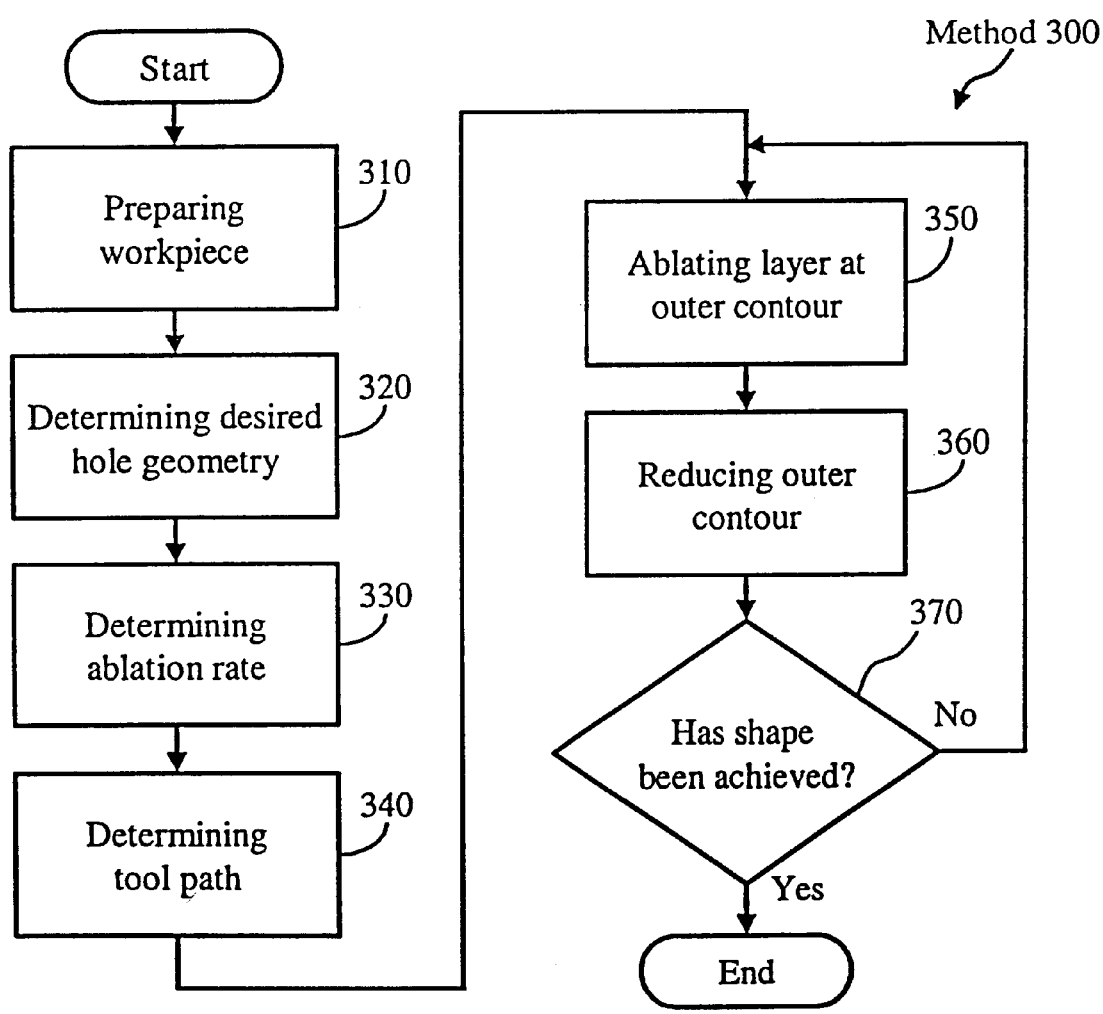
FIG. 3 is a flowchart diagram depicting a method of laser milling.

Referring to FIG. 3, method 300 of laser milling includes several steps. At step 310, an operator places a customer-specified material (such as metal, polymer, ceramic, semiconductor material, or any other suitable material) on a sample stage as workpiece 155 in preparation for laser milling. In this example, workpiece 155 is 50 $\mu$m to 150 $\mu$m thick and flat; however, in alternate embodiments, the present invention may be generalized for thicker, non-planar materials.

According to the present invention, it is possible to successively vary layer width in a predetermined fashion to accommodate for a non-planar surface. With through-holes, however, such variation may not be necessary, but further, alternative embodiments for non-through holes are also available. For example, an alternative to varying layer width is to successively ablate layers of uniform width from an inner contour to an outer contour either before or after drilling the non-through-hole in order to plane out a non-planar surface. Tool pitch can also be successively varied if the non-planar surface contour is not described by a half-angle. How to successively redefine the outer and/or inner contours also may vary depending on whether the surface is concave, convex, or both. Layer width variation can also be combined with tool pitch variation and/or outer/inner contour redefinition to achieve the desired shape.

At step 320, the operator defines the desired hole shape of target area 240 based on customer specifications. In the present example, as shown in FIG. 2e, a typical cone-shaped tapered hole is described; however, the present invention is not limited to a specific hole shape design. Half angle 255 typically ranges between 30 to 50 degrees, but may be any angle between 10 and 80 degrees, within the physical limits of the laser drilling system 100, that satisfy the end application. Outer diameter 260 is determined by a combination of three factors. A first factor is desired exit hole 280 diameter, which in one example is 20 $\mu$m but may be as wide as 200 $\mu$m or as narrow as 1 $\mu$m. A second factor is thickness of workpiece 155, which is determined by client specifications, typically 50 $\mu$m to 150 $\mu$m; however, this measurement may vary with the end application. If a specific exit hole depth is required, exit hole depth 290 must also be considered in determining the desired hole geometry. A third factor is the client-specified half angle 255 within workpiece 155.

At step 330, the operator determines the ablation rate (or material removal rate) with a given set of laser drilling parameters. Governing parameters of ablation rate include repetition rate, spot size, and laser power. Prior to milling workpiece 155, a number of trial milling runs are performed to measure and make adjustments to laser drilling system 100 to affect the ablation rate. Once the ablation rate is identified, this value is used to determine the number of contours (or layers) required in the tool path by dividing the desired depth of ablation by the ablation rate and is incorporated into a specific tool path algorithm.

The depth of first ablation 220, in the present example, is 1 $\mu$m; however, the depth of first ablation 220 may be as deep as 10 $\mu$m, or as shallow as 0.001 $\mu$m, depending on the desired geometric shape of target area 240.

At step 340, the milling algorithm (or alternatively, "tool path algorithm") determines the "drilling strategy" using the desired hole geometry, the ablation rate, and spot size of laser drilling system 100. These parameters help set the behavior required to move from outer diameter 280 to the exit hole diameter 260. The milling algorithm calculates the number of contours based on the ablation rate and ablation depth 235 required, then calculates the tool pitch 250 for each successive contour on the spot size and desired taper. The milling algorithm uses this information, as well as the coordinates for the contour shape, to guide laser drilling system 100 throughout the milling process.

In this example, the ablation depth 235 is illustrated in first ablation 220 as 1 $\mu$m per layer and tool pitch 250 is shown as 1 $\mu$m in FIG. 2. These measurements create half angle 255, which in this embodiment measures 45 degrees. However, in alternate embodiments, variations in laser conditions and spot size may result in ablation depths that range from 10 $\mu$m per layer to 0.001 $\mu$m per layer, and tool pitch 250 may range from 10 $\mu$m to 0.001 $\mu$m.

At step 350, the milling algorithm performs first ablation 220 at the outer diameter 280 within workpiece 155, as shown in FIGS. 4a, 4d, and 2e above. Ablation of workpiece 155 within entire target area 240 at pre-determined ablation depth 235 based on the ablation rate is performed using laser system 100 per the pre-determined tool path algorithm. In this example, ablation depth 235 is 1 $\mu$m per layer; however, this depth may vary, as noted in step 340.

At step 360, the milling algorithm performs second ablation 230 on the outer contour of target area 240 within workpiece 155, as shown in FIGS. 4a and 4d above. Tool pitch 250 is determined as described in step 340 and is implemented using the pre-determined tool path algorithm. Laser 105 parameters and desired half angle 255 determine the ablation zone within target area 240.

In the present example, to achieve desired half angle 255, the outer contour is reduced by 1 $\mu$m in diameter while maintaining a depth of 1 $\mu$m across target area 240 of workpiece 155. For successive ablations, outer contour is reduced by 1 $\mu$m, while maintaining ablation depth of 1 $\mu$m across target area 240. This process continues until desired milling taper and depth is achieved, as shown in FIG. 4b above.

At step 370, the milling algorithm determines whether the desired milled shape has been achieved. The milled shape is considered to be achieved when the milling algorithm has completed the pre-set number of contours. Half angle 255 is measured to determine if the desired hole geometry has been reached. If yes, method 300 ends; if no, method 300 returns to step 350. In the present embodiment, this step is done off-line. That is, the milling method is executed with a pre-determined number of layers. Workpiece 155 is then removed and half angle 255 is measured outside of laser drilling system 100 to determine if it meets the customer specifications. However, in alternate embodiments, this determination is made within laser drilling system 100.

The present invention has several advantages. A first advantage of the present invention is that it provides a way to mill geometrically repeatable holes using parallel processing. A second advantage of the present invention is that it provides a way to mill holes of varying shapes that require controlled taper angles. A third advantage of the present invention is that it provides a way to mill holes in a variety of materials with varying material thickness. A fourth advantage of the present invention is that it provides a way to mill materials without requiring a masking process. A fifth advantage of the present invention is that it increases the aspect ratio of a milled material. A sixth advantage of the present invention is that it is a programmable method. A seventh advantage of the present invention is that it avoids introducing ablated debris onto the workpiece.

One disadvantage of the present invention is that milling operations can be time consuming. However, any milling operation will require a similar amount of time to perform and thus is not a significant concern.

Figure 4:
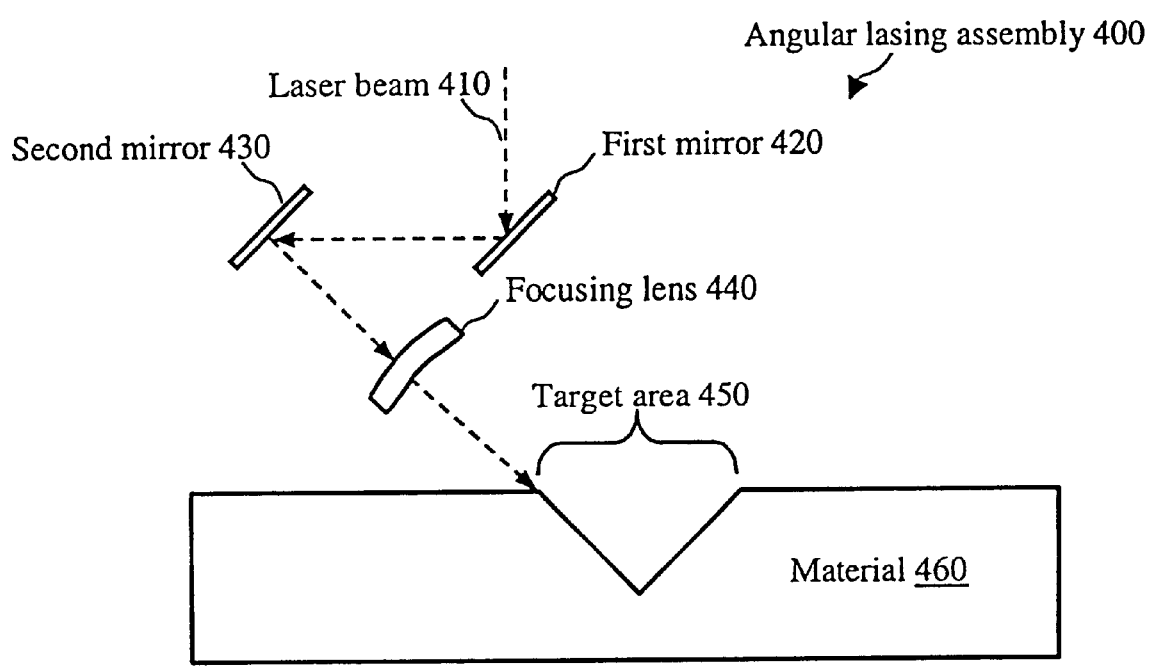
FIG. 4 is a block diagram of an angular lasing assembly.

There also exist other ways to solve the same problem. Referring to FIG. 4, a first other way to solve the same problem is to use an angular lasing assembly 400 to perform the milling process. However, as described below, this way does not allow parallel processing of target areas. Angular lasing assembly 400 includes a laser beam 410 that propagates along the optical path of a first mirror 420 and a second mirror 430 where it is focused onto a target area 450 of a material 460 by a focusing lens 440. In operation, angular lasing assembly 400 rotates on a vertical axis in a predetermined angular state to allow a 360-degree circular rotation of laser beam 410 along target area 450, thereby forming the desired taper angle. The rotational design of angular lasing assembly 400 precludes the use of multiple beams for parallel processing.

Figure 5:
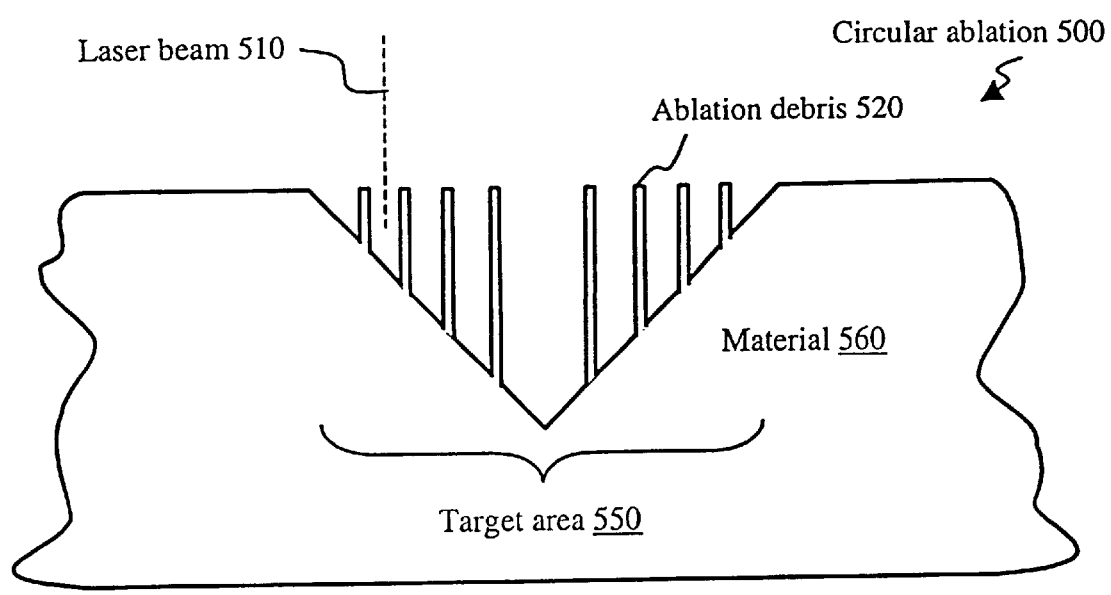
FIG. 5 is a cross-sectional view of circular ablation.

Referring to FIG. 5, a second other way to solve the same problem is to use a circular ablation 500. However, as described below, circular ablation 500 causes undesirable buildup of ablated material within the target area. Circular ablation 500 requires a laser beam 510, a target area 550, and a quantity of material 560. In operation, circular ablation 500 is performed as laser beam 510 moves in a 360-degree path perpendicular to that of target area 550. Laser beam 510 provides sufficient energy to remove material 560 from target area 550. However, ablation debris 520 is deposited on the walls of target area 550.

A nozzle plate of an ink-jet head may be constructed with the laser drilling system of the present invention as further detailed below.

Figure 6:
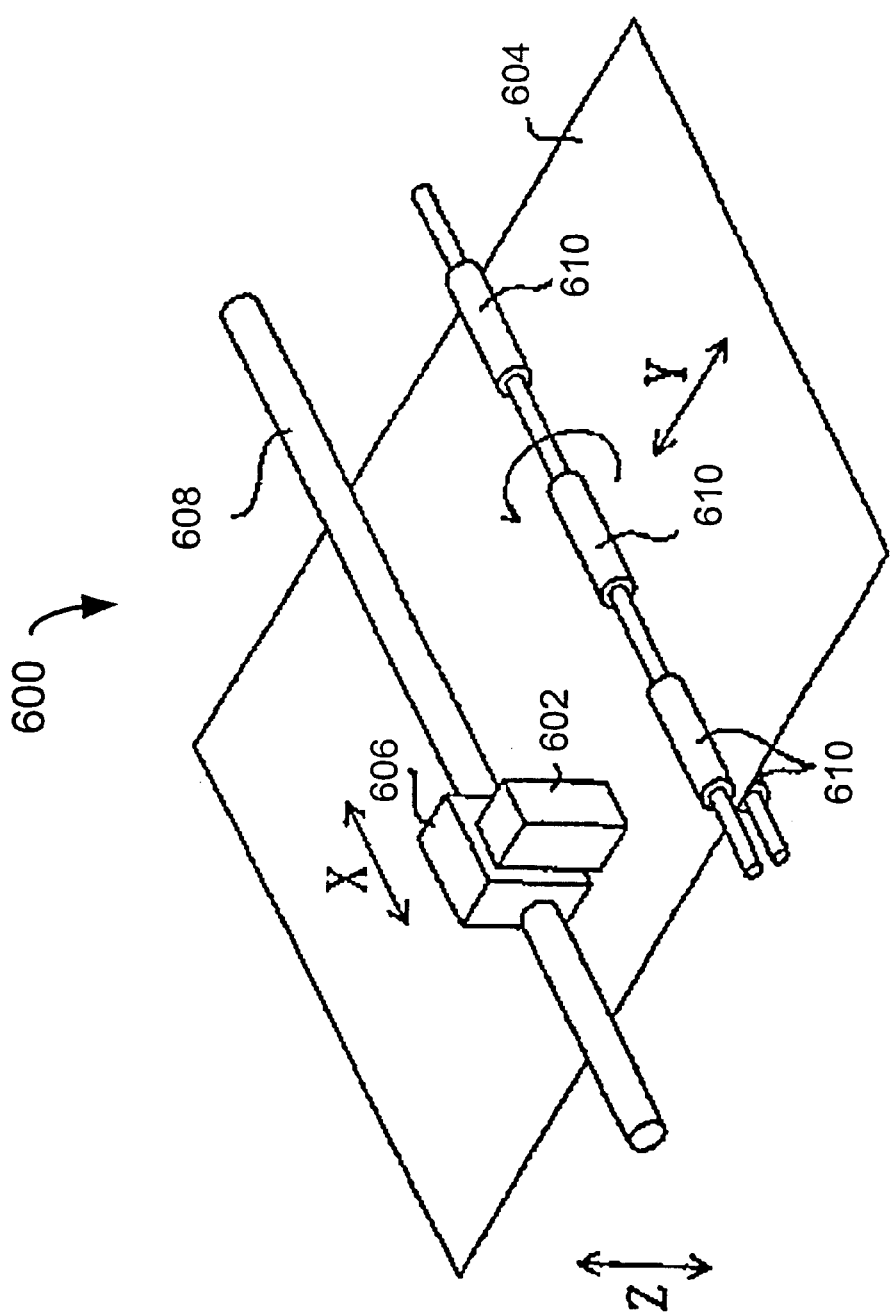
FIG. 6 is a perspective view showing major constituent components of an ink-jet printer.

As shown in FIG. 6, an ink-jet printer 600 has an ink-jet head 602 capable of recording on a recording medium 604 via a pressure generator. Ink droplets emitted from the ink-jet head 602 are deposited on the recording medium 604, such as a sheet of copy paper, so that recording can be performed on the recording medium 604. The ink-jet head 602 is mounted on a carriage 606 capable of reciprocating movement along a carriage shaft 608. More specifically, the ink-jet head 602 is structured such that it can reciprocate in a primary scanning direction X in parallel with the carriage shaft 608. The recording medium 604 is timely conveyed by rollers 610 in a secondary scanning direction Y. The ink-jet head 602 and the recording medium 604 are relatively moved by the rollers 610.

Figure 7:
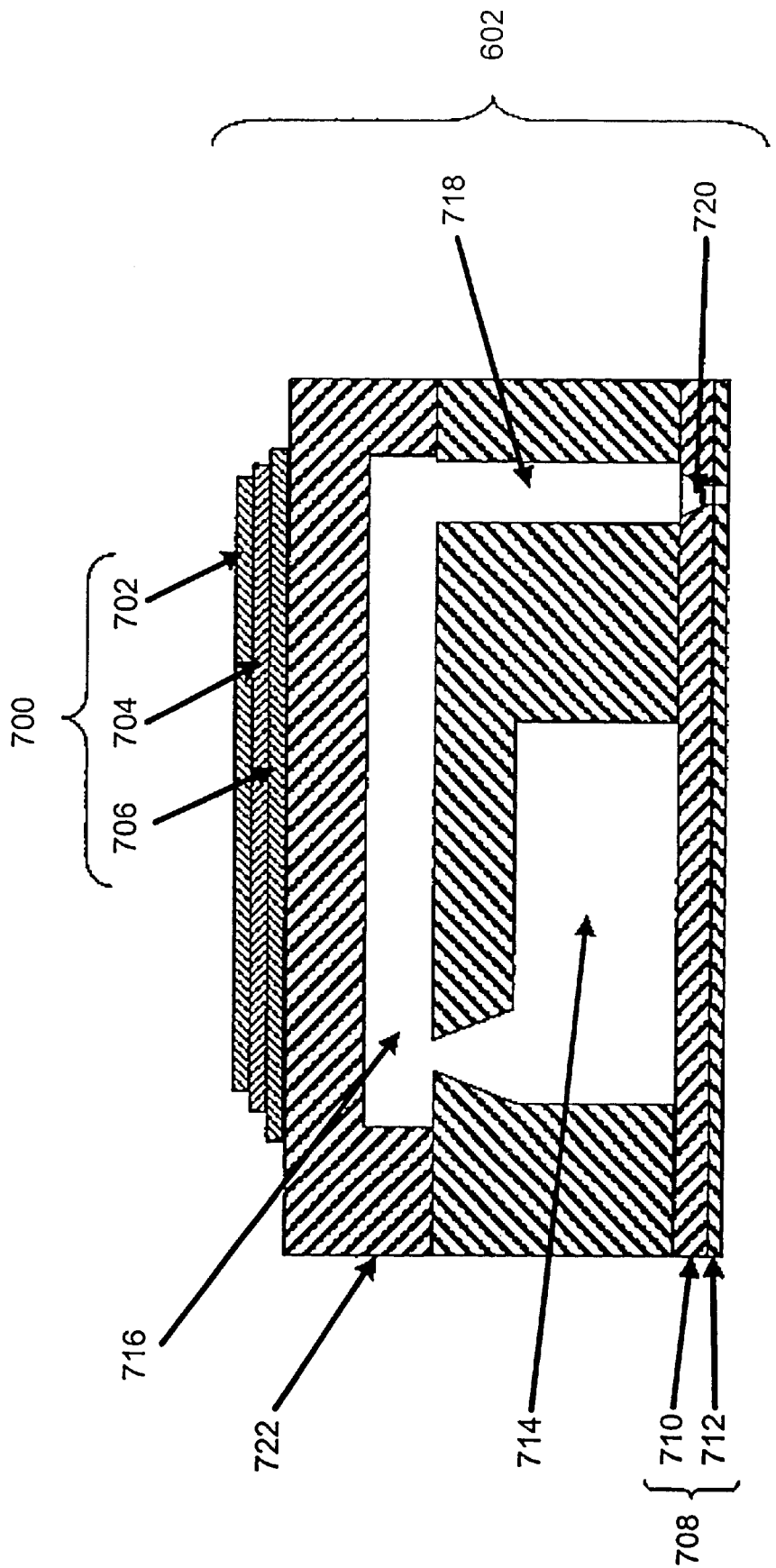
FIG. 7 is a schematic cross-sectional view of an ink-jet head.

Referring to FIG. 7, a pressure generator 700 is preferably a piezoelectric system, a thermal system, and/or equivalent system. In this embodiment, the pressure generator 700 corresponds to a piezoelectric system which comprises an upper electrode 702, a piezoelectric element 704, and an under electrode 706. A nozzle plate 708 comprises a nozzle substrate 710 and a water repellent layer 712. The nozzle substrate 710 is made of metal, resin, and/or equivalent material. The water repellant layer 712 is made, for example, of fluororesin or silicone resin. In this embodiment, the nozzle substrate 710 is made of stainless steel and has a thickness of 50 um, and the water repellent layer 712 is made of a fluororesin and has a thickness of 0.1 um. The ink-jet ink is filled in an ink supplying passage 714, a pressure chamber 716, an ink passage 718, and a nozzle 720. Ink droplets are ejected from the nozzle 720 as the pressure generator 700 pushes the pressure chamber element 720.

As a result of the present invention, very good nozzles are formed without flash and foreign matter (carbon etc) in the nozzle plate. Further, the accuracy of the nozzle outlet diameter is 20 um±1.5 um.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method of performing laser milling comprising:
    causing a laser beam to converge substantially on an exposed surface of a workpiece within a region of the exposed surface bounded by an outer contour;
    ablating a layer of workpiece material at the outer contour by using a two-dimensional tool path to trace with the laser beam an area of surface region of the workpiece substantially bounded by the outer contour;
    reducing a size of the outer contour in preparation for ablation of a successive layer; and
    determining whether a predetermined shape has been achieved.

2. The method of claim 1 further comprising preparing a workpiece.

3. The method of claim 2, wherein said preparing a workpiece corresponds to placing a predetermined workpiece material on a sample stage.

4. The method of claim 2 further comprising determining a three-dimensional hole geometry.

5. The method of claim 4, wherein said determining a three-dimensional hole geometry corresponds to identifying an outer diameter based on a thickness of the workpiece, a predetermined half-angle, a predetermined exit hole diameter.

6. The method of claim 5, wherein said determining a three-dimensional hole geometry further corresponds to identifying an outer diameter based on an exit hole depth.

7. The method of claim 4 further comprising determining an ablation rate.

8. The method of claim 7, wherein said determining an ablation rate corresponds to performing a number of trial milling runs under predetermined repetition rate, spot size, and laser power parameters, thereby identifying an ablation rate under actual operating conditions.

9. The method of claim 7 further comprising determining a tool path.

10. The method of claim 9, wherein said determining a tool path comprises:
    calculating a number of contours based on a predetermined depth of ablation and the ablation rate; and
    calculating a tool pitch for each successive contour based on predetermined spot size and a predetermined contour of the three-dimensional hole geometry.

11. A laser milling system comprising:
    a tool path module operable to determine a two-dimensional tool path for ablating a layer of material from an exposed surface of a workpiece with a laser;
    a plurality of lasers operable to perform ablation of a plurality of workpieces according to the two-dimensional tool path by tracing with a laser beam substantially converging on an exposed surface of a workpiece an area of surface region of the workpiece substantially bounded by an outer contour; and
    a control module operable to modify the tool path to accomplish removal of successive layers of material from the plurality of workpieces, wherein the successive layers of material respectively decrease in area, thereby affecting a predetermined contour.

12. The system of claim 11 comprising a plurality of sample stages operable to bear workpieces.

13. The system of claim 12, wherein said tool path module is operable to determine an initial contour based on the predetermined contour and a predetermined final contour at a specified depth.

14. The system of claim 13, wherein said tool path module is operable to calculate a number of contours based on a predetermined depth of ablation and an ablation rate.

15. The system of claim 14, wherein said tool path module is operable to calculate a tool pitch for each successive contour based on predetermined spot size and the predetermined contour.

16. The system of claim 15, wherein said plurality of lasers is operable via parallel processing to at least one of:

simultaneously perform ablation of multiple workpieces according to the tool path, wherein ablated regions of each workpiece are composed of substantially identical material and have substantially identical geometric characteristics, and simultaneously perform ablations of multiple regions of a workpiece according to the tool path, wherein each of said multiple regions is composed of substantially identical material and has substantially identical geometric characteristics.

17. A method of laser milling comprising:

determining a two-dimensional tool path for ablating a layer of material bounded by an outer contour from an exposed surface of a workpiece with a laser;

ablating a layer of material from the exposed surface of the workpiece with a laser according to the tool path by using the two-dimensional tool path to trace with a laser beam substantially converging on the exposed surface of a workpiece an area of surface region of the workpiece substantially bounded by the outer contour; and modifying the tool path by successively decreasing a size of the outer contour to accomplish removal of successive layers of material from a newly exposed surface of the workpiece, wherein the successive layers of material respectively decrease in area, thereby affecting a predetermined contour in the laser milled workpiece.

18. The system of claim 17, wherein said determining a tool path comprises determining an initial contour based on the predetermined contour and a predetermined final contour at a specified depth.

19. The system of claim 17, wherein said determining a tool path comprises calculating a number of contours based on a predetermined depth of ablation and an ablation rate.

20. The system of claim 17, wherein said determining a tool path comprises calculating a tool pitch for each successive contour based on predetermined spot size and the predetermined contour.

21. A workpiece having an aperture formed therein via successive laser ablation of layers of workpiece material performed by using a two-dimensional tool oath to trace with a laser beam substantially converging on an exposed surface of the workpiece an area of surface region of the workpiece substantially bounded by an outer contour of successively diminishing size, wherein the layers are of substantially uniform thickness and successively diminishing area.

22. The workpiece of claim 21, wherein the workpiece is further defined as a nozzle plate having a nozzle formed therein via successive laser ablation of layers of nozzle plate material, wherein the layers are of substantially uniform thickness and successively diminishing area.

23. An ink-jet head having an inkjet nozzle corresponding to the workpiece of claim 22, wherein the layers are of substantially round shape, and successively diminish in area in a manner substantially describing a half-angle through the nozzle plate material.

24. A inkjet printer having the inkjet head of claim 23.

* * * * *

UNITED STATES PATENT AND TRADEMARK OFFICE
CERTIFICATE OF CORRECTION

PATENT NO.   : 6,627,844 B2
DATED        : September 30, 2003
INVENTOR(S)  : Xinbing Liu et al.

It is certified that error appears in the above-identified patent and that said Letters Patent is hereby corrected as shown below:

Column 8,
Line 16, after "half-angle," insert -- and --.

Column 10,
Line 12, "oath" should be -- path --.

Signed and Sealed this

Eleventh Day of May, 2004

JON W. DUDAS
*Acting Director of the United States Patent and Trademark Office*